United States Patent
Kozuka et al.

(10) Patent No.: US 6,999,356 B2
(45) Date of Patent: Feb. 14, 2006

(54) SEMICONDUCTOR DEVICE CAPABLE OF READJUSTING A REFERENCE POTENTIAL DURING THE RELIABILTY TEST

(75) Inventors: Eiji Kozuka, Tokyo (JP); Yasuhiro Suematsu, Kanagawa (JP); Kazuaki Kawaguchi, Kanagawa (JP); Mikio Miyata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/941,999

(22) Filed: Sep. 16, 2004

(65) Prior Publication Data

US 2005/0088870 A1   Apr. 28, 2005

(30) Foreign Application Priority Data

Sep. 30, 2003   (JP)   ............................. 2003-340131

(51) Int. Cl.
*G11C 7/14*   (2006.01)
(52) U.S. Cl. .............. 365/189.09; 365/201; 365/225.7; 327/543
(58) Field of Classification Search ................ 365/201, 365/189.09, 225.7, 210; 327/541, 543

See application file for complete search history.

(56) References Cited

U.S. PATENT DOCUMENTS

| | | | |
|---|---|---|---|
| 6,430,101 B1 * | 8/2002 | Toda | 365/225.7 |
| 6,469,573 B1 * | 10/2002 | Kanda et al. | 327/541 |
| 6,567,333 B1 * | 5/2003 | Toda | 365/225.7 |
| 6,674,318 B1 * | 1/2004 | Kanda et al. | 327/540 |

FOREIGN PATENT DOCUMENTS

JP   2001-216040   8/2001

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A semiconductor device that generates a desired internal power supply by using, as a reference potential, a potential obtained by adjusting a preset standard potential, the semiconductor device comprises; a reference potential selection circuit selecting the reference potential on the basis of digital data from among a plurality of potentials of different levels which are obtained by dividing a power supply voltage, and outputting the reference potential instead of the standard potential; a first decision circuit deciding bits of the digital data; a second decision circuit deciding the bits of the digital data, separately from the first decision circuit; and a data transfer circuit transferring to the reference potential selection circuit the digital data which is decided by either one of the first and second decision circuits.

18 Claims, 14 Drawing Sheets

DATA SELECTION CIRCUIT 50

|  | PRETMBGR0 | PRETMBGR1 | PRETMBGR2 |
|---|---|---|---|
| TMBGR0 | 1 | 0 | 1 |
| TMBGR1 | 0 | 1 | 1 |
| TMBGR2 | 1 | 1 | 1 | ← STANDARD POTENTIAL
| TMBGR3 | 0 | 0 | 1 |
| TMBGR4 | 1 | 0 | 0 |
| DESELECT | 0 | 1 | 0 |
|  | 1 | 1 | 0 |
|  | 0 | 0 | 0 |

STANDARD DATA SELECTION CIRCUIT 52

STANDARD DATA TRANSFER CIRCUIT 34

DATA SELECTION CIRCUIT 54

SEMICONDUCTOR DEVICE CAPABLE OF READJUSTING A REFERENCE POTENTIAL DURING THE RELIABILTY TEST

CROSS-REFERENCE TO RELATED APPLICATIONS

This application is based upon and claims the benefit of priority from the prior Japanese Patent Application No. 2003-340131, filed on Sep. 30, 2003, the entire contents of which are incorporated herein by reference.

BACKGROUND OF THE INVENTION

1. Field of the Invention

The present invention relates to a semiconductor device and a method for testing the same.

2. Related Background Art

The actuation of a semiconductor memory (for example, to read out therefrom or write therein data) requires various potentials. To supply all the potentials from outside, many kinds of external power supplies will be needed. This inevitably calls for a large and complex system that effects the operation of the semiconductor memory. Besides, the necessity for mounting many external power supply terminals on the semiconductor chip increases the chip area and the package size accordingly.

To cope with this, it is customary in the art to supply power from a single power source to the semiconductor chip and generate therein potentials necessary for its operation (which potentials will hereinafter be referred to also as internal potentials). The internal potentials of various levels are each generated based on a potential (hereinafter referred to also as a reference potential) obtained by dividing the potential of the external power supply.

Generally, the reference potential may sometimes deviate from a design value due to stresses applied to the semiconductor wafer during the semiconductor manufacturing process. FIG. 14 is a diagram showing a conventional semiconductor device test procedure. Semiconductor elements formed on the semiconductor wafers in the semiconductor manufacturing process are tested for each die in a D/S (Die/Sort) step. At this time, the reference potential is also measured (S1). If a deviation of the reference potential from the design value is found, the reference potential is trimmed to be close to the design value (S2). This is done by physically cutting a wiring or wirings on the semiconductor wafer through laser irradiation. A description is given below of a conventional reference potential generator for trimming the reference potential.

FIG. 15 is a block diagram of a conventional reference potential generator 500 that generates a reference potential VBGR. Data decision circuits 540-0 to 540-2, which form part of the reference potential generator 500, are each configured as shown in FIG. 16. Each data decision circuit 540 has a fuse 541. Depending on whether or not the fuse 541 in step S2, the data decision circuits 540-0 to 540-2 output high- or low-level 1-bit data as signals SELECT0 to SELECT2.

Referring back to FIG. 15, data transfer circuits 530-0 to 530-2 respectively transfer the signals SELECT0 to SELECT2 to a decode circuit 520. The data transfer circuits 530-0 to 530-2 are also capable of transferring test mode signals TMFUSEDIS to the decode circuit 520 instead of sending thereto the signals SELECT0 to SELECT2.

FIG. 17 shows the configuration of the decode circuit 520, which receives the signals SELECT0 to SELECT2 or TMFUSEDIS as 3-bit digital data composed of signals PRETMBGR0 to PRETMBGR2. Based on the digital data it receives, the decode circuit 520 makes any one of signals TMBGR0 to TMBGR4 high-level and sends it to a reference potential selection circuit 510. FIG. 5 shows the relationships between the signals PRETMBGR0 to PRETMBGR2 and the signals TMBGR0 to TMBGR4. For example, the decode circuit 520 makes the signal TMBGR1 high-level by making the signal PRETMBGR0 low-level and the signals PRETMBGR1 and PRETMBGR2 high-level.

FIG. 18 shows the configuration of the reference potential selection circuit 510, which divides the power supply voltage by resistors R1 and R2 to generate a plurality of different potentials. Based on that one of the signals TMBGR0 to TMBGR4 which is sent thereto, the reference potential selection circuit 510 selects any one of potentials BGR to BGR4, and outputs the selected potential as the reference potential VBGR. For example, when the signal TMBGR1 is high-level, a switch SW1 operates, and the reference potential selection circuit 510 outputs the potential BGR1 as the reference potential VBGR.

In the test mode, the decode circuit 520 receives the test mode signals TMFUSEDIS as digital data, and outputs the signals TMBGR0 to TMBGR4 based on the test mode signals. The reference potential selection circuit 510 responds to the signals TMBGR0 to TMBGR4 to output a preset default potential (hereinafter referred to as a standard potential) as the reference potential VBGR. For example, when the potential BGR2 is the standard potential, the signal TMFUSEDIS is preset so that the reference potential selection circuit 510 selects the potential BGR2.

Referring back to FIG. 14, trimming of the reference potential VBGR in step S2 is followed by a final semiconductor test of the semiconductor wafer (S3), which is thereafter divided into individual semiconductor chips and packaged in an assembling step (S4) and in a packaging step (S5), respectively. Following this, the semiconductor chips undergo a reliability test (S6) and a packaging final test (S7), and are shipped as products.

One possible cause for a semiconductor chip to fail the reliable test (S6) is a deviation of the reference potential VBGR from a design value. The reason for this is that the reference potential VBGR, though adjusted to the design value in step S2, shifts again due to stresses applied to the chip in the reliability test. Since no trimming is possible in the reliable test (S6), however, the semiconductor chip decided as a reject is discarded.

In the D/S step 12, trimming is carried out (S2) on the assumption that the resistors R1 and R2 in FIG. 18 have their design values. Accordingly, the reference potential VBGR does not always become close to the design value, but in some cases it further deviates from the design value.

In the prior art, since the reference potential VBGR measuring step (S1) and the fuse blowing step (2) are separate from each other, an exact value of the trimmed reference potential VBGR cannot be known prior to the fuse blowing step.

To obviate the above-mentioned defects of the prior art, there is a demand for a semiconductor device and its testing method that permits re-trimming or readjustment of the reference potential in the reliability test for each semiconductor chip.

Also, there is a demand for a semiconductor device and its testing method that permits the selection of a reference potential closest to its design value in the test of semiconductor elements for each die and in the adjustment of the reference potential.

SUMMARY OF THE INVENTION

A semiconductor device according to an embodiment of the invention that generates a desired internal power supply by using, as a reference potential, a potential obtained by adjusting a preset standard potential, the semiconductor device comprises a reference potential selection circuit selecting said reference potential on the basis of digital data from among a plurality of potentials of different levels which are obtained by dividing a power supply voltage, and outputting said reference potential in place of said standard potential; a first decision circuit deciding bits of said digital data; a second decision circuit deciding the bits of said digital data, separately from said first decision circuit; and a data transfer circuit transferring to said reference potential selection circuit said digital data which is decided by either one of said first and second decision circuits.

A method for testing a semiconductor device according to an embodiment of the invention that includes: a reference potential selection circuit selecting a reference potential on the basis of digital data from among a plurality of potentials of different levels which are obtained by dividing a power supply voltage, and outputting said reference potential in place of a standard potential preset by default so as to generate a desired internal power supply; a first decision circuit deciding the value of said digital data; a second decision circuit deciding the value of said digital data separately from said first decision circuit; a test data input portion tentatively inputting various pieces of digital data of different values from output; and a data transfer circuit transferring digital data which is fed thereto from any one of said first decision circuit, said second decision circuit and said test data input portion to said reference potential selection circuit; the method comprising:

transferring said various pieces of digital data of different levels from said test data input portion to said reference potential selection circuit by said data transfer circuit, and measuring reference potentials on the basis of said various pieces of digital data of different levels, respectively; and setting first digital data in said first decision circuit, said first digital data generating first one of said reference potentials which is optimum for the generation of said desired internal power supply.

DETAILED DESCRIPTION OF THE INVENTION

Embodiments of the present invention are described below with reference to the accompanying drawings. However, the invention is not limited by the embodiments.

A reference potential generator according to the present invention includes a plurality of data decision circuits, and is capable of supplying a reference potential selection circuit with digital data decided by one of the data decision circuits in place of digital data decided by the other. This permits readjustment of the reference potential in the reliability test. The reference potential generator has a test data input unit, and is capable of temporarily transferring digital data of various values to the reference potential selection circuit in place of the digital data decided by the data decision circuits. This ensures adjustment of the reference potential to bring it closer to the design value.

(First Embodiment)

Figure 1:
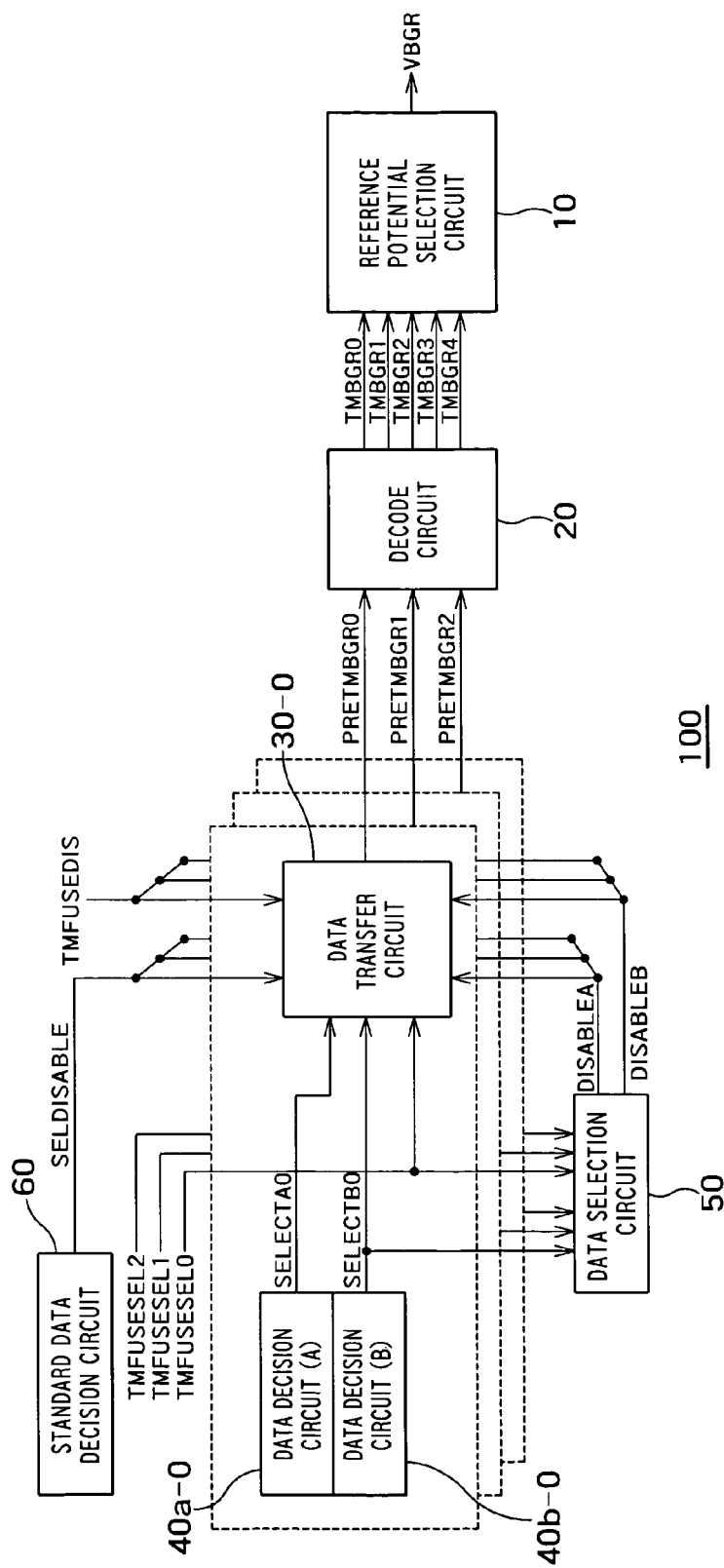
FIG. 1 is a block diagram of a reference potential generator 100 according to a first embodiment of the present invention.
Figure 17:
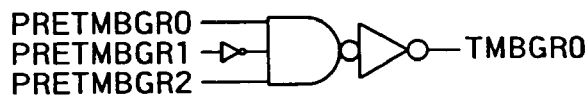
FIG. 17 shows the configuration of a decode circuit 520.
Figure 17:
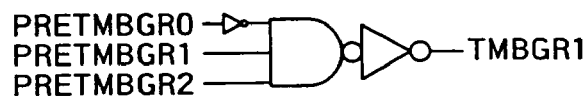
Figure 17:
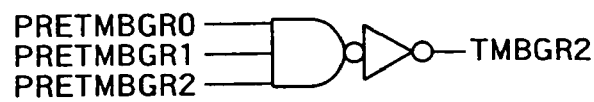
Figure 17:
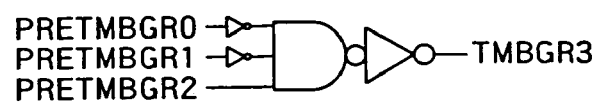
Figure 17:
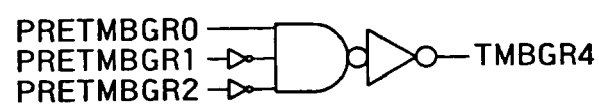
Figure 18:
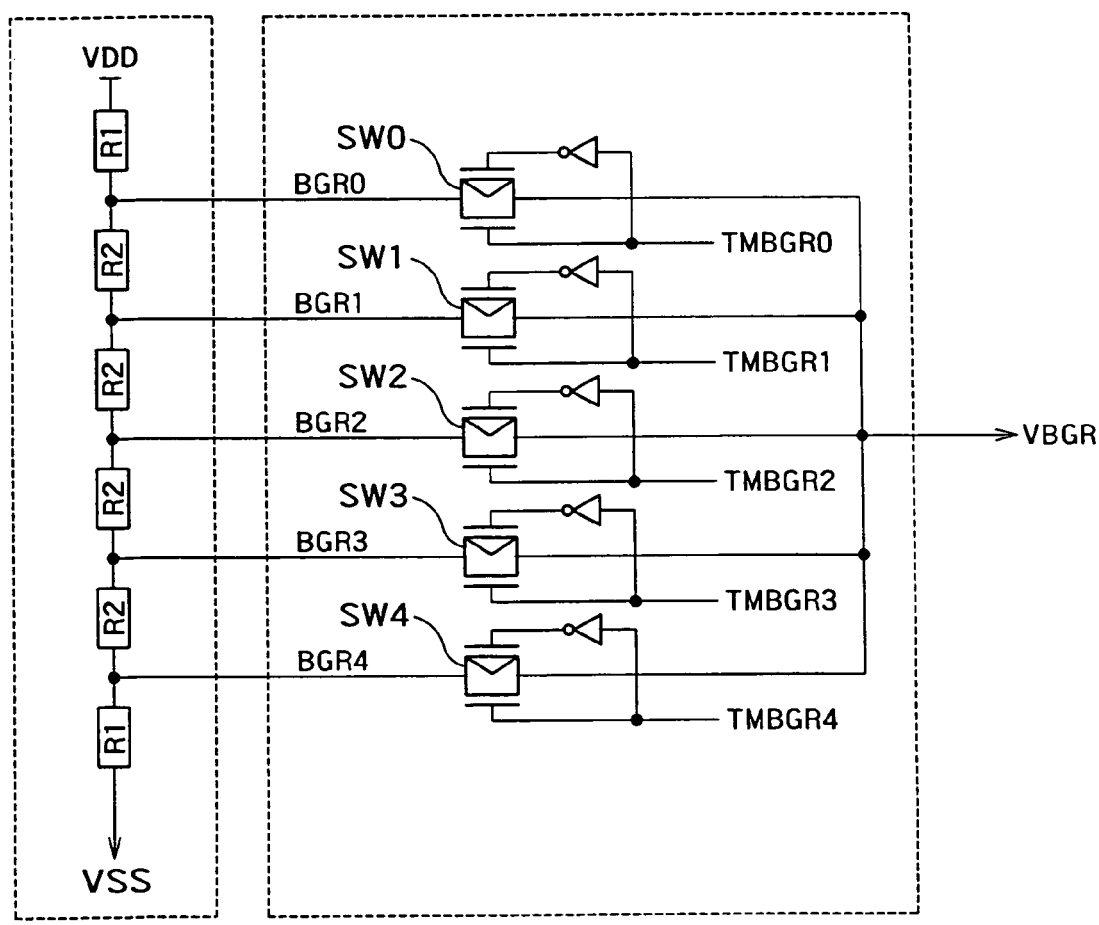
FIG. 18 shows the configuration of the reference potential selection circuit 510.

FIG. 1 is a block diagram of a reference potential generator 100 according to a first embodiment of the present invention. The reference potential generator 100 includes: a reference potential selector circuit 10; decode circuit 20; data transfer circuits 30-0 to 30-2; data decision circuits 40a-0 to 40a-2; data decision circuits 40b-0 to 40b-2; an input data selection circuit 50; and a standard data decision circuit 60. The reference potential selection circuit 10 and the decode circuit 20 may have the same configurations as shown in FIGS. 18 and 17, respectively.

Figure 7:
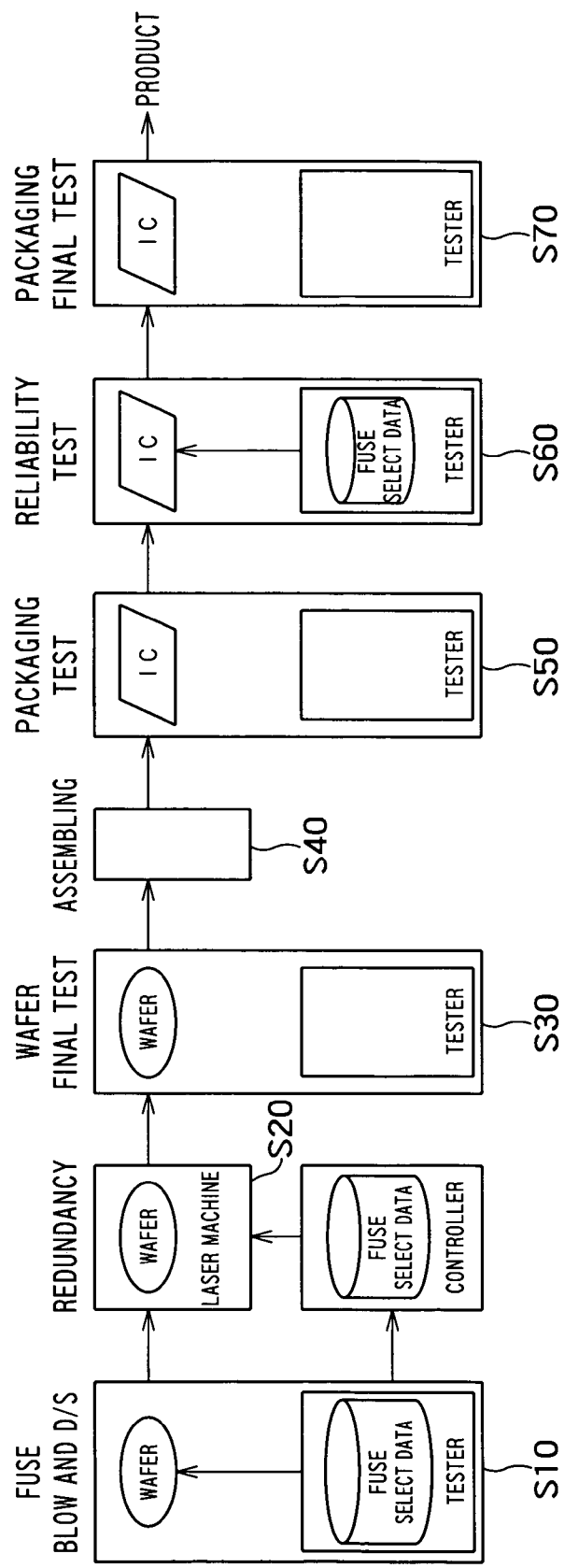
FIG. 7 is a conceptual diagram of testing a semiconductor device which comprises the reference potential generator 100.

The data decision circuits 40a-0 to 40a-2 are used in the D/S step in FIG. 7, whereas the data decision circuits 40b-0 to 40b-2 are used in the reliability test. The standard data decision circuit 60 is used when a standard potential is selected in the reliability test.

The reference potential generator 100 has an input part that temporarily inputs signals TMFUSESEL0 to TMFUSESEL2 and a signal TMFUSEDIS from outside in the test mode. These signals are used in the test mode, but on power-off, they are stopped.

Figure 2:
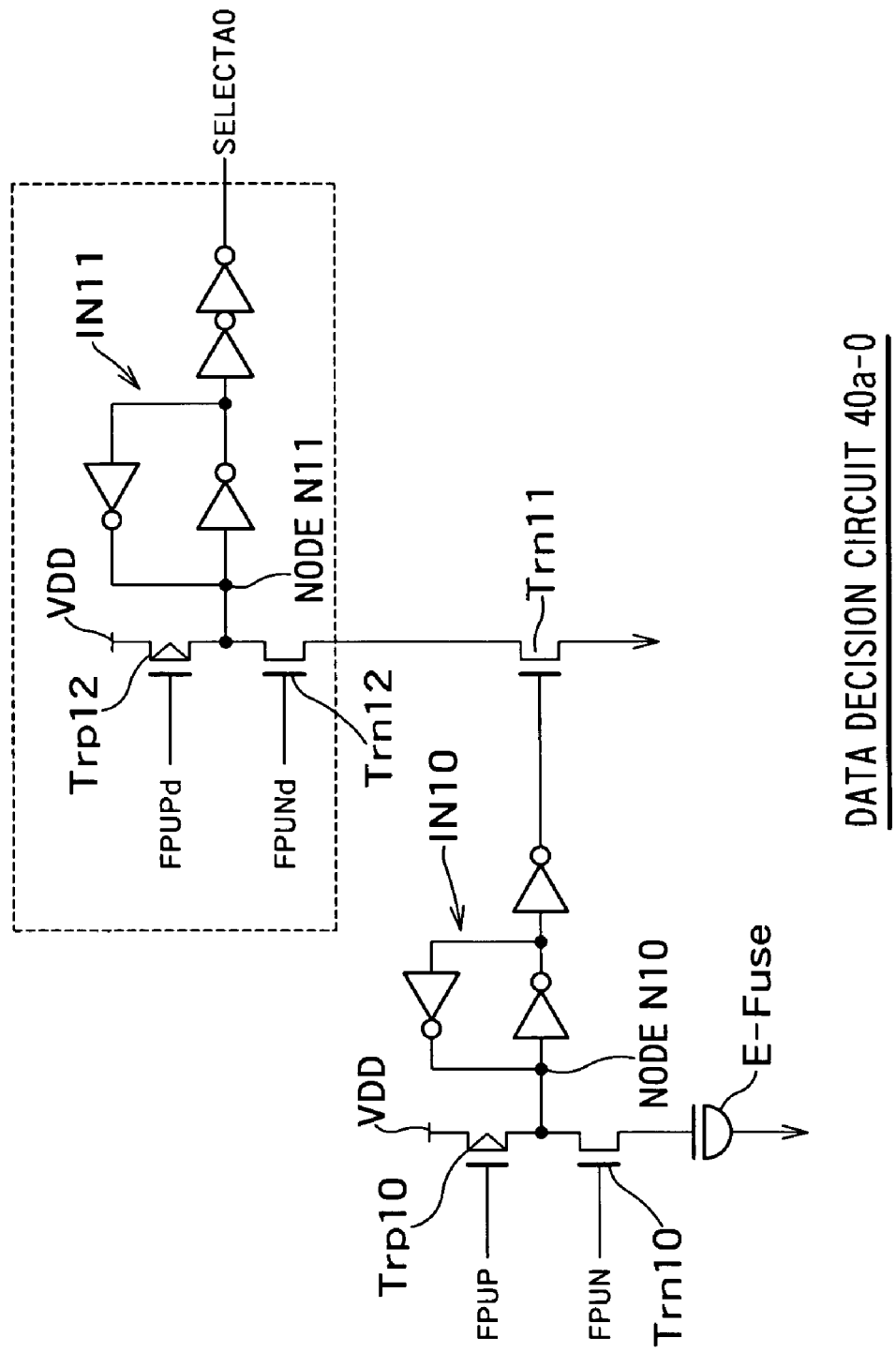
FIG. 2 is a circuit diagram showing the configuration of a data decision circuit 40a-0.

FIG. 2 is a circuit diagram showing the configuration of the data decision circuit 40a-0. The data decision circuits 40a-1 to 40a-2 and 40b-0 to 40b-2 have the same configuration as that of the data decision circuit 40a-0.

Figure 3:
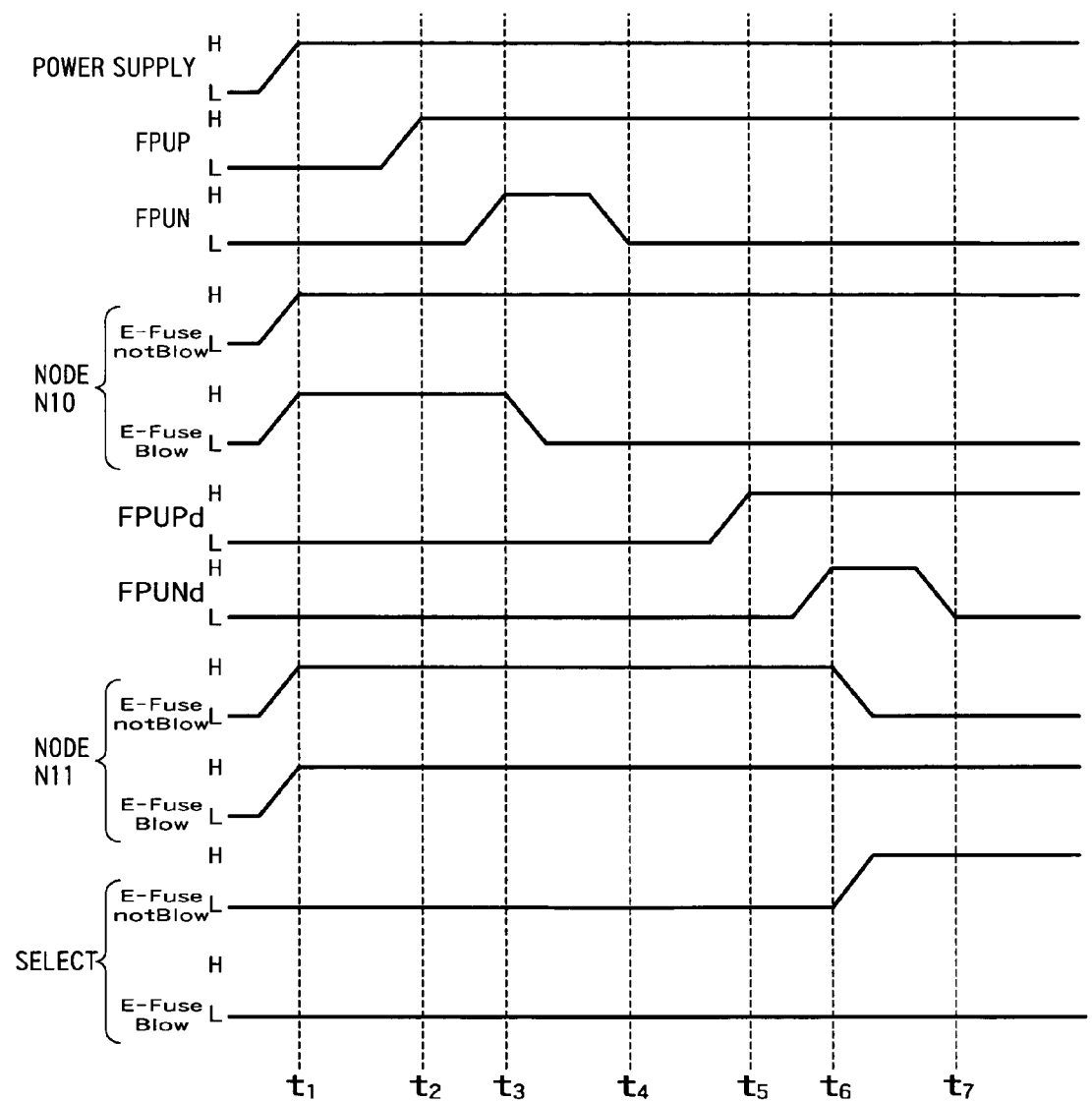
FIG. 3 is a timing chart showing the operation of a data decision circuit 40a-0.

FIG. 3 is a timing chart showing the operation of the data decision circuit 40a-0. The other data decision circuits 40a-1 to 40*a*-2 and 40*b*-0 to 40*b*-2 operate in the same manner as does the data decision circuit 40*a*-0. With reference to FIGS. 2 and 3, the configuration and the operation of the data decision circuit 40*a*-0 are described below.

The data decision circuit 40*a*-0 has a fuse E-Fuse, which can electrically be treated unlike a fuse called an L-Fuse which is cut by a laser. The fuse E-Fuse is nonconducting when untreated and conducts when treated.

A description is given first of the operation of the data decision circuit 40*a*-0 when the fuse E-Fuse is not blown, that is, when it is nonconducting without being electrically treated. In FIG. 3, the operation is indicated by "E-Fuse not Blow."

On power-up at time t1, gate potentials FPUP and FPUN both are in low. At this time, since a transistor Trp10 turns ON and a transistor Trn10 turns OFF, the potential at a node N10 goes high by the power supply voltage VDD.

At time t2, the gate potential FPUP goes high. As a result, the transistor Trn10 turns OFF, but since the potential at the node N10 remains high and is latched in an inverter circuit In10.

At time t3, the gate potential FPUN goes high, turning ON the transistor Trn10, but since the fuse E-Fuse is nonconducting, the potential at the node N10 remains high. Accordingly, a transistor Trn11 turns ON.

At time t4, the gate potential FPUN goes low, turning OFF the transistor Trn10, but since the potential at the node N10 is still latched in the inverter circuit In10, the transistor Trn11 remains ON.

From time t1 to t4, gate potentials FPUPd and FPUNd are both held low. Hence, transistors Trp12 and Trn12 are in the ON state and in the OFF state, respectively. Accordingly, the potential at a node N11 is high at the beginning.

At time t5, the gate potential FPUPd goes high, turning OFF the transistor Trp12, but the potential at the node N11 is still latched in an inverter circuit In11.

At time t6, the gate potential FPUNd goes low, turning ON the transistor Trn12. Since at this time the transistor Trn11 is ON, the potential at the node N11 goes low. As a result, a signal SELECT goes high.

At time t7, the gate potential FPUNd goes low, turning OFF the transistor Trn12, but since the potential at the node N11 is latched as "low" in the inverter circuit In11, the signal SELECT remains high.

A description is given of the operation of the data decision circuit 40*a*-0 which is effected when the fuse E-Fuse is blown, that is when it is electrically treated and hence is conducting. In FIG. 3, the operation is indicated by "E-Fuse Blow." The operation from time t1 to t2 is the same as in the case where the fuse E-Fuse is nonconducting.

When the gate potential FPUN goes high at time t3, the transistor Trn10 turns ON. Since the fuse E-fuse is conducting at this time, the potential at the node N10 goes low, turning OFF the transistor Trn11.

At time t4, the gate potential FPUN goes low, turning OFF the transistor Trn10. At this time, the transistor Trp10 is also OFF. Accordingly, the potential at the node N10 is latched as being "low" in the inverter circuit In10. Hence, the transistor Trn11 remains OFF.

At time t5, the gate potential FPUPd goes high, turning OFF the transistor Trp12, but the potential at the node N11 is latched as being "high" in the inverter circuit In11.

At time t6 the gate potential FPUNd goes high, turning ON the transistor Trn11. Since the transistor Trn11 is OFF at this time, the potential at the node N11 remains high, making the signal SELECT low.

At time t7 the gate potential FPUNd goes low, turning OFF the transistor Trn12, but the potential at the node N11 is still latched as being "high" in the inverter circuit In11. This causes the signal SELECT to remain low.

As described above, the data decision circuit 40*a*-0 outputs a high-level signal as the signal SELECT when the fuse E-Fuse is nonconducting, and outputs a low-level signal as the signal SELECT when the fuse E-Fuse is conducting. Accordingly, the data decision circuit 40*a*-0 changes the potential of the signal SELECT, depending on the fuse E-Fuse is conducting or nonconducting, and decides a bit value based on the potential of the signal SELECT. Incidentally, the electrical treatment of the fuse is also called trimming.

The data decision circuits 40*a*-0 to 40*a*-2 output 1-bit signals SELECTA0 to SELECTA2, respectively, and the data decision circuits 40*b*-0 to 40*b*-2 also output 1-bit signals SELECTB0 to SELECTB2, respectively.

The standard data decision circuit 60 outputs an inverted potential of the output potential shown in FIG. 2. To perform this, the standard data decision circuit 60 has a configuration that includes an inverter additionally placed in the output unit shown in FIG. 2 or that excludes one of the existing inverters in the output unit shown in FIG. 2. The standard data decision circuit 60 is identical in construction with that of FIG. 2 except the above.

Figures 4, 5:
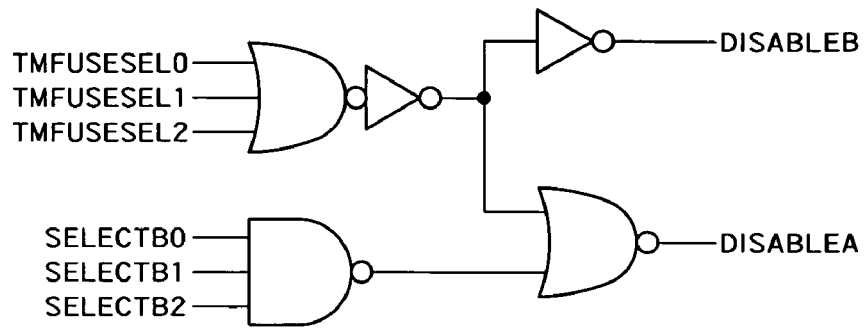
FIG. 4 is a circuit diagram showing the configuration of a data selection circuit 50.
FIG. 5 is a table showing the relationships between signals PRETMBGR0 to PRETMBGR2 and signals TMBGR0 to TMBGR4.

In this embodiment, when the reference potential generator 100 outputs the standard potential as the reference potential VBGR, the signals PRETMBGR0 to PRETMBGR2, which are sent to the decode circuit 20, are set so that they all have the same bit values "111" (see FIG. 5). In this instance, the standard data decision circuit 60 sends signals SELDISABLEn of the same bit value to the data transfer circuits 30-0 to 30-2. Accordingly, this embodiment requires only one standard data decision circuit 60.

Referring back to FIG. 1, the test signals TMFUSESEL0 to TMFUSESEL2 are input from outside in the test mode. Since the test signals TMFUSESEL0 to TMFUSESEL2 may be changed variously, digital data also may have various values. Based on such various pieces of digital data, any of the signals TMBGR0 to TMBGR4 can be selected.

In this embodiment, while not in the test mode, the test signals TMFUSESEL0 to TMFUSESEL2 are all in the low state "000". AT this time, the data selection circuit 50 deselects the test signals TMFUSESEL0 to TMFUSESEL2.

FIG. 4 is a circuit diagram showing the configuration of the data selection circuit 50. The data selection circuit 50 is configured to select any one of the digital data output from the data decision circuits 40*a*-0 to 40*a*-2, the digital data output from the data decision circuits 40*b*-0 to 40*b*-2, and digital data composed of the test signals TMFUSESEL0 to TMFUSESEL2.

For example, when the signals SELECTB0 to SELECTB2 are all high and the signals TMFUSESEL0 to TMFUSESEL2 are all low, the data selection circuit 50 makes both of signals DISABLEA and DISABLEB high. In this case, the data selection circuit 50 selects the digital data output from the data decision circuits 40*a*-0 to 40*a*-2. Because any one of the signals SELECTB0 to SELECTB2 being low means that any one of the data decision circuits 40*b*-0 to 40*b*-2 is not trimmed (see FIG. 2), and the signals TMFUSESEL0 to TMFUSESEL2 being all low means that the current mode is not the test mode.

When any one of the signals SELECTB0 to SELECTB2 is low and the signals TMFUSESEL0 to TMFUSESEL2 are all low, the data selection circuit 50 makes the signal DISABLEA low, and the signal DISABLEB high. In this instance, the data selection circuit 50 selects the digital data output from the data decision circuits 40b-0 to 40b-2. Because any one of the signals SELECTB0 to SELECTB2 being low means that any one of the data decision circuits 40b-0 to 40b-2 is trimmed, and the signals TMFUSESEL0 to TMFUSESEL2 being all low means that the current mode is not the test mode.

When any one of the signals TMFUSESEL0 to TMFUSESEL2 is high, the data selection circuit 50 makes both of the signals DISABLEA and DISABLEB low irrespective of the states of the signals SELECTB0 to SELECTB2. In this instance, the data selection circuit 50 selects the digital data composed of the signals TMFUSESEL0 to TMFUSESEL2. The reason for this is that any one of the signals TMFUSESEL0 to TMFUSESEL2 is high means the test mode.

As described above, the data selection circuit 50 is capable of selecting any one of the digital data output from the data decision circuits 40a-0 to 40a-2, the digital data output from the data decision circuits 40b-0 to 40b-2, and the digital data composed of the test signals TMFUSESEL0 to TMFUSESEL2.

FIG. 5 is a table showing the relationships between the signals PRETMBGR0 to PRETMBGR2 and the signals TMBGR0 to TMBGR4. This embodiment is set so that the signal TMBGR2 generates the standard potential.

When the standard potential is used as the reference potential VBGR in the test mode, it is necessary to input, separately of the test signals TMFUSESEL0 to TMFUSESEL2, a standard test signal TMFUSEIS that makes all of the signals PRETMBGR0 to PRETMNBGR2 high "111." The reason for this is that in the case of making all of the signals PRETMBGR high by the test signals TMFUSESEL0 to TMFUSESEL2, all the test signals need to be low "000," which causes the data selection circuit 50 to deselect the test signals TMFUSESEL0 to TMFUSESEL2. Accordingly, the test mode requires the standard test signal TMFUSEDIS that is used to output the standard potential.

As in the test mode, the data decision circuits 40b-0 to 40b-2 cannot be set to use the standard potential as the reference potential VBGR, either. The reason for this is that in the case of using the standard potential as the reference one VBGR, all of the signals SELECTB0 to SELECTB2 need to be high "111," which causes the data selection circuit 50 to deselect the signals SELECTB0 to SELECTB2. Accordingly, the standard data decision circuit 60 is required to set the standard potential as the reference potential VBGR.

Figure 6:
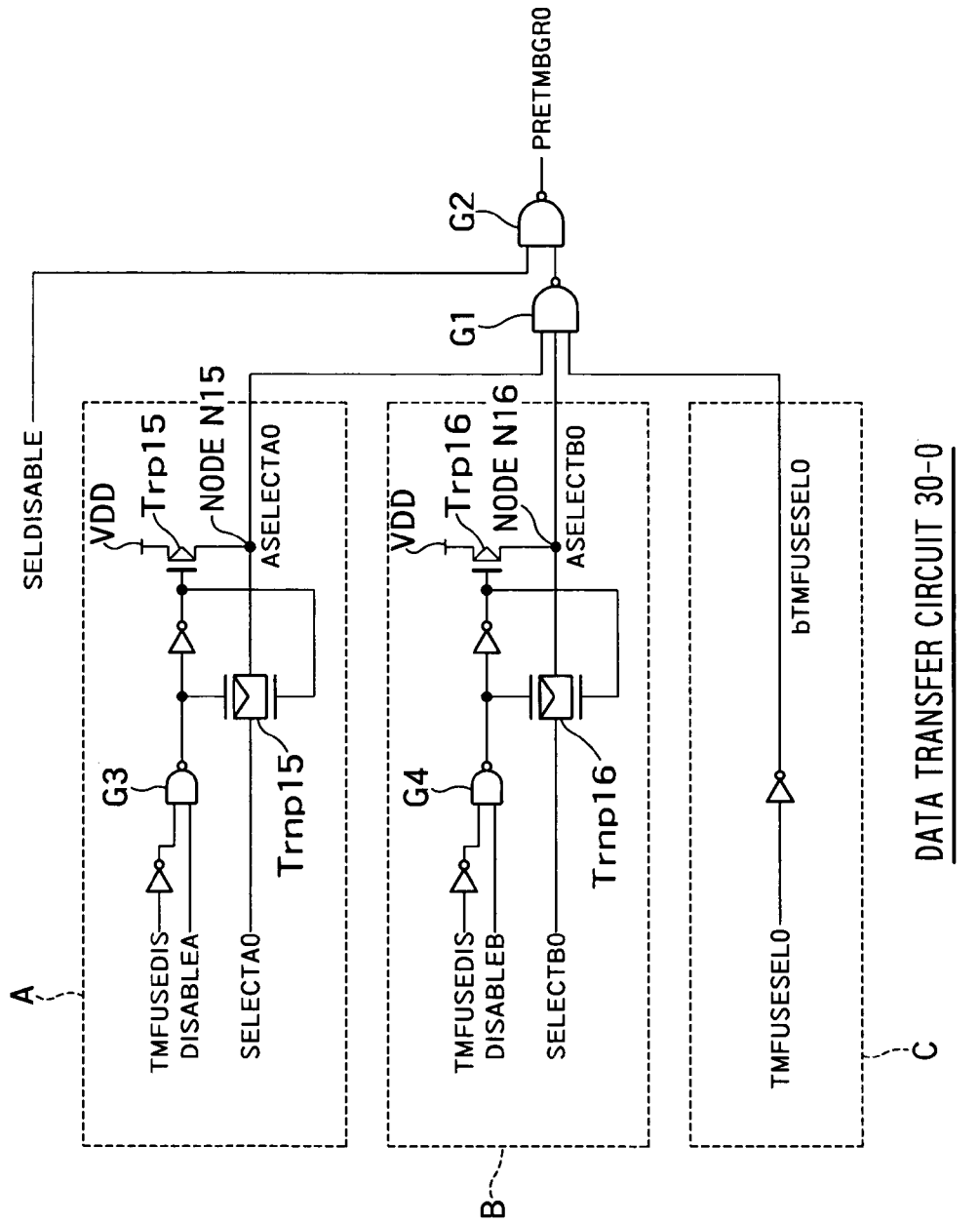
FIG. 6 is a circuit diagram of a data transfer circuit 30-0.

FIG. 6 is a circuit diagram of the data transfer circuit 30-0. The other data transfer circuits 30-1 to 30-2 are common in construction to the data transfer circuit 30-0. It should be noted here that the data transfer circuits 30-0 to 30-2 each input thereto and output therefrom different data.

With reference to FIG. 6, the configuration and the operation of the data transfer circuit 30-0 are described below. The broken-line box A indicates a configuration related to the data decision circuit 40a-0, the broken-line box B indicates a configuration related to the data decision circuit 40b-0, and the broken-line box C indicates a configuration related to the test mode.

In the broken-line box A, the data transfer circuit 30-0 receives the signal SELECTA0 from the data decision circuit 40a-0. The signal SELECTA0 is sent via a transistor Trnp15 to a node N15. The power supply voltage VDD is applied via a transistor Trp15 to the node N15. Accordingly, the potential of a signal ASELECTA0 at the node N15 is either the potential of the signal SELECTA0 or the potential of the power supply voltage VDD (always high).

The signal DISABLEA is the data output from the data selection circuit 50 (see FIG. 4). The signal TMFUSEDIS is used to output the standard potential as the reference potential VBGR in the test mode. The signal TMFUSEDIS is high only in the test mode, and is low in the other modes.

When the data selection circuit selects the data decision circuits 40a-0 to 40a-2, the signal DISABLEA is high and the signal TMFUSEDIS is low. Accordingly, the transistor Trnp15 turns ON and the transistor Trp15 turns OFF. As a result, the signal SELECTA0 is sent to the node N15, where it becomes the above-mentioned signal ASELECTA0.

When the data selection circuit 50 does not select the data decision circuits 40a-0 to 40a-2, or in the test mode, the signal DISABLEA is low or the signal TMFUSEDIS is high. Accordingly, the transistor Trnp15 turns OFF and the transistor Trp15 turns ON. As a result, the power supply voltage VDD is applied to the node N15 to generate the signal ASELECTA0. That is, in this case, the signal ASELECTA0 is always high.

In the broken-line box B, the data transfer circuit 30-0 receives the signal SELECTB0 from the data decision circuit 40b-0. The signal SELECTB0 is applied via a transistor Trnp16 to a node N16. The power supply voltage VDD is applied via a transistor Trp16 to the node N16. Accordingly, the potential of a signal ASELECTB0 at the node N16 is either the potential of the signal SELECTB0 or the potential of the power supply voltage VDD.

When the data selection circuit 50 selects the data decision circuits 40b-0 to 40b-2, the signal DISABLEB is high and the signal TMFUSEDIS is low. Accordingly, the transistor Trnp16 turns ON and the transistor Trp16 turns OFF. As a result, the signal SELECTB0 is sent to the node N16, where it becomes the above-mentioned signal ASELECTB0.

On the contrary, when the data selection circuit 50 does not select the data decision circuits 40b-0 to 40b-2, or in the test mode, the signal DISABLEB is low or the signal TMFUSEDIS is high. Accordingly, the transistor Trnp16 turns OFF and the transistor Trp16 turns ON. As a result, the power supply voltage VDD is applied to the node N16 to generate the signal ASELECTB0. That is, in this case, the signal ASELECTB0 is always high.

In the broken-line box C, the data transfer circuit 30-0 receives an external test signal TMFUSESEL0, which is always low except in the test mode and at the time of selecting the standard potential. A NAND gate G1 is supplied with a signal bTMFUSESEL0 that is an inverted version of the test signal TMFUSESEL0. That is, the signal bTMFUSESEL0 is always high except in the test mode and at the time of selecting the standard potential.

As described above, signals from two deselected ones of the data decision circuits 40a-0 to 40a-2 (broken-line box A), the data decision circuit 40b-0 to 40b-2 (broken-line box B) and the test mode (broken-line box C) are always high. The NAND gate G1 sends an inverted version of the signal from the selected box to a NAND gate G2. The NAND gate G2 is supplied with the inverted signal and the signal SELDISABLE from the standard data decision circuit 60. When the standard data decision circuit 60 is not selected, the signal SELDISABLE is always high. Accordingly, the signal from the selected one of the data decision circuit 40a-0 to 40a-2 (broken-line box A), the data decision circuits 40b-0 to 40b-2 (broken-line box B) and the test mode (broken-line box C) is output as the signal PRETMBGR0.

When the standard potential is selected, none of the data decision circuits 40a-0 to 40a-2 (broken-line box A), the data decision circuits 40b-0 to 40b-2 (broken-line box B)

and the test mode (broken-line box) is selected, and the signal SEDISABLE from the standard data decision circuit 60 is output. At this time, the signals ASELECTA0 and ASELECTB0 are both high and the signal bTMFUSESEL0 is low. As a result, the output from the NAND gate G1 becomes always high, outputting the potential of the signal SEDISABLE as the signal PRETMBGR0.

As described above, the data transfer circuit 30-0 transfers any one of the signals SELECTA0, SELECTB0 and bTM-FUSESEL0 or SELDISABLE as the signal PRETMBGR0.

Figure 8:
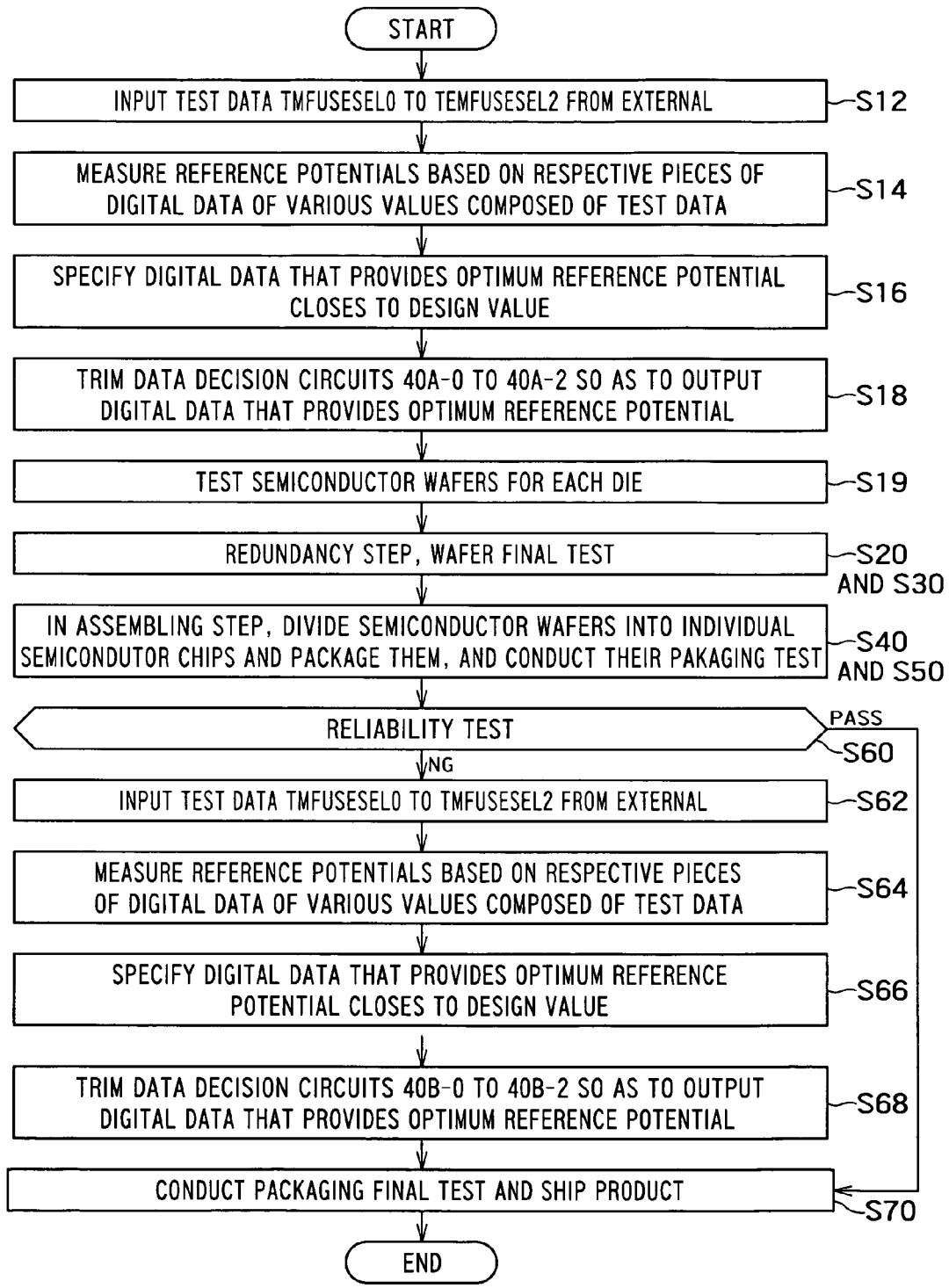
FIG. 8 is a flowchart of the procedure for testing the semiconductor device which comprises the reference potential generator 100.

FIG. 7 is a conceptual diagram of testing a semiconductor device equipped with the reference potential generator 100. FIG. 8 is a flowchart of the procedure for testing the semiconductor device equipped with the reference potential generator 100. In a front-end of the semiconductor manufacturing, semiconductor elements are formed on the semiconductor wafer.

The D/S step (S10) begins with inputting the test signals TMFUSESEL0 to TMFUSESEL2 from outside (S12). By changing or modifying the test signals TMFUSESEL0 to TMFUSESEL2, it is possible to obtain pieces of digital data of various values. The next step is to measure reference potentials VBGR based on the pieces of digital data of various values (S14). In the case of using the standard potential to conduct the test, the standard test signal TMFUSEDIS is input from outside.

The next step is to specify the digital data for generating the optimum reference potential VBGR closest to the design value (S16). The data decision circuits 40a-0 to 40a-2 are trimmed to output the optimum digital data (S18). The trimming can be achieved electrically without using a laser, and hence it can be done in the D/S step. Thereafter the semiconductor elements on the semiconductor wafer are tested for each die.

For example, when it is found that TMBGR1 in FIG. 5 is the optimum, the data decision circuits 40a-0 to 40a-2 are so trimmed as to output "011." When the optimum reference potential VBGR closest to the design value is the standard potential, the data decision circuits 40a-0 to 40a-2 are not trimmed. In this instance, the standard potential is output as the reference potential VBGR based on the digital data that the standard data decision circuit 60 outputs.

Redundancy (S20) and a wafer final test (S30) are carried out next. In this case, since the data decision circuits 40a-0 to 40a-2 are already trimmed, circuits (for example, memory circuit and so on) other than the reference potential generator 100 are trimmed in the redundancy step (S20). In the wafer final test (S30), the results of trimming in the redundancy step (S20) are tested. Accordingly, the redundancy step (S20) and the wafer final test step (S30) are essentially unnecessary for the reference potential generator 100.

Thereafter, in the assembling step, the semiconductor wafer is divided into individual semiconductor chips, which are each packaged (S40). This is followed by a packaging test (S50).

The reliability test (S60) is then conducted. Semiconductor chips decided as defective in the reliability test includes those rejected by reason of variations of the reference potential VBGR. In this case, the external test signals TMFUSESEL0 to TMFUSESEL2 are input (S62). By changing or modifying the test signals TMFUSESEL0 to TMFUSESEL2, pieces of digital data of various values. The next step is to measure reference potentials VBGR based on the pieces of digital data of various values (S64). In the case of using the standard potential to conduct the test, the standard test signal TMFUSEIS is input from outside.

The next step is to specify the digital data for generating the optimum reference potential VBGR closest to the design value (S66). The data decision circuits 40b-0 to 40b-2 are trimmed to output the optimum digital data (S68). The trimming can be achieved electrically without using a laser, and hence it can be done in the reliability test step.

For example, when it is found at the time of the reliability test that TMBGR0 is optimum although TMBGR1 was selected in the D/S step, the data decision circuits 40b-0 to 40b-2 are so trimmed as to output "101." When the optimum reference potential VBGR closest to the design value is the standard potential, the data decision circuits 40b-0 to 40b-2 are not trimmed. In this instance, the standard potential is output as the reference potential VBGR based on the digital data that the standard data decision circuit 60 outputs.

Further, the semiconductor chips undergo a packaging final test (S70). Thereafter the semiconductor chips are shipped as products. The semiconductor chips decided as non-defective in the reliability test of step S60 undergo the packaging final test in step S70 without going through steps S62 to S68.

In this embodiment, the data selection circuit 50 is capable of selecting the test signals TMFUSESEL0 to TMFUSESEL2. This allows the reference potential generator 100 to operate in the test mode in the D/S step (S10) and to input various pieces of digital data from external. By this, it is possible to measure the actual reference potential VBGR corresponding to each piece of digital data. As a result, the data decision circuits 40a-0 to 40a-2 can be so trimmed as to output optimum digital data in the D/S step.

According to this embodiment, the data decision circuits 40ab-0 to 40b-2 are each equipped with the electrically treatable fuse E-Fuse. Accordingly, the data decision circuits 40b-0 to 40b-2 can be trimmed in the reliability test (S60). This trimming permits correction of a shift or deviation of the reference voltage VBGR due to stresses applied to the semiconductor chip in the assembling step (S40) or in the packaging test (S50). As a result, it is to recover the semiconductor chips rejected as defective in the reliability test (S60).

In the reliability test (S60), too, the data selection circuit 50 is capable of selecting the test signals TMFUSESEL0 to TMFUSESEL2. This allows the reference potential generator 100 to operate in the test mode in the D/S step (S10) to input various pieces of digital data from external. By this, it is possible to measure the actual reference potential VBGR corresponding to each piece of digital data. As a result, the data decision circuits 40b-0 to 40b-2 can be so trimmed as to output optimum digital data in the reliability test.

The data decision circuits 40a-0 to 40a-2 are each provided with the electrically treatable fuse E-Fuse. Accordingly, in the D/S step (S10) it is possible to perform trimming of the data decision circuits 40a-0 to 40a-2 as well as the electrical test including the measurement of the reference potential VBGR.

Figure 16:
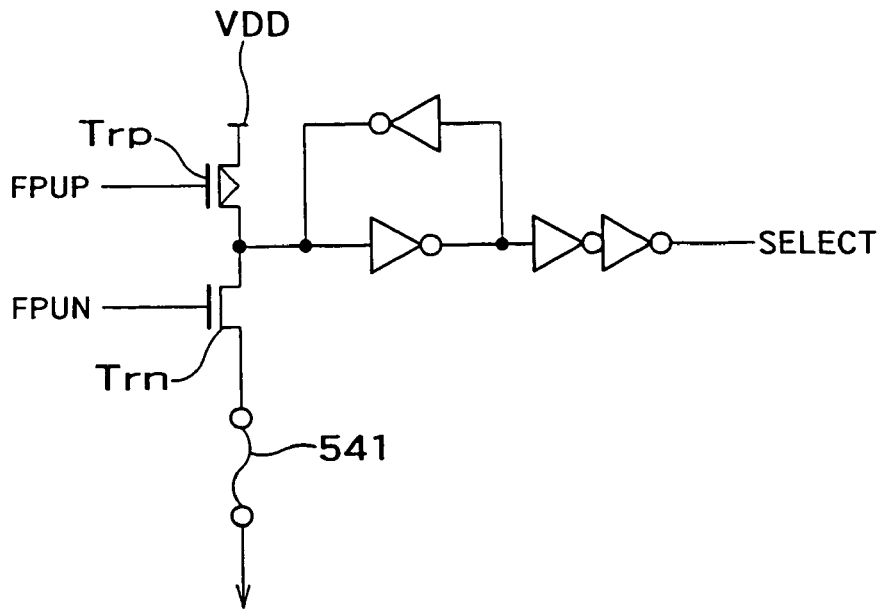
FIG. 16 is a circuit diagram showing the configuration of a data decision circuit 540-0 to 540-2.

The data decision circuits 40a-0 to 40a-2 may be of such a configuration as shown in FIG. 16. In such an instance, a laser trimming step is needed separately of the D/S step. On the other hand, the data decision circuits 40b-0 to 40b-2 each have the configuration shown in FIG. 2, and hence they can be re-trimmed in the reliability test (S60) to output optimum digital data.

While in this embodiment, the digital data has been described as being 3-bit data, it may also be of 2 or 1 bit, or 4 or more bits. In this case, the data decision circuits 40a, 40b and the data transfer circuits 30 are respectively provided by a number equal to that of bits of the digital data used. The number of the test signals TMFUSESEL to be input from outside is also equal to the number of bits.

For example, when the digital data is 8-bit, the reference potential generator 100 needs only to be provided with data decision circuits 40a-0 to 40a-7, data decision circuits 40b-0 to 40b-7 and data transfer circuits 30-0 to 30-7. In the test mode test signals TMFUSESEL0 to TMFUSESEL7 are input from outside.

In the above the signals PRETMBGR0 to PRETMBGR2 are set at "111," but this value can properly be changed. This can be done by changing the settings of the signals TMFUSESEDIS and the standard data decision circuit 60 to conform with the signals PRETMBGR0 to PRETMBGR2 which generate the standard potential.

(Second Embodiment)

Figure 9:
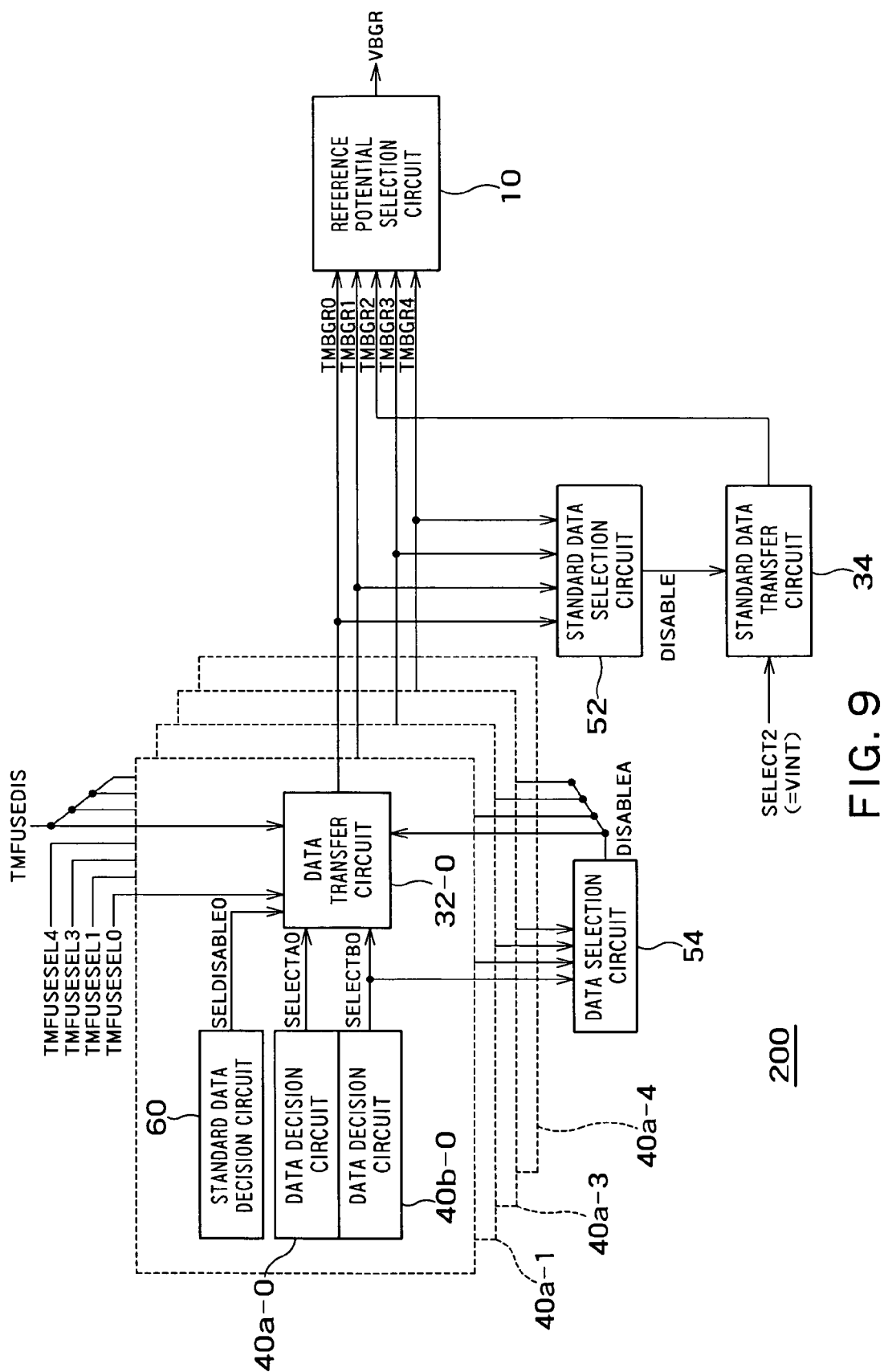
FIG. 9 is a block diagram of a reference potential generator 200 according to a second embodiment of the present invention.

FIG. 9 is a block diagram of a reference potential generator 200 according to a second embodiment of the present invention. The reference potential generator 200 does not have the decode circuit 20, and the signals TMBGR0 to TMBGR4 are transferred directly to the reference potential selection circuit 10 from a data transfer circuits 32-0 to 32-3 and a standard data transfer circuit 34. Like parts corresponding to those in the first embodiment are designated by like reference numerals. In this embodiment, the signals TMBGR0 to TMBGR4 are used as digital data. When the signal TMBGR2 is high, the standard potential is output as the reference potential VBGR.

The data decision circuits 40a, the data decision circuits 40b and the data transfer circuits 32 are respectively provided by a number equal to that having subtracted the reference potential from the number of signals TMBGR, that is, equal to a number having subtracted by one from the number of bits forming the digital data. In this embodiment, the reference potential generator 200 includes: data decision circuits 40a-0, 40a-1, 40a-3 and 40a-4 (hereinafter referred to also as data decision circuits 40a-0 to 40a-4); data decision circuits 40b-0, 40b-1, 40b-3 and 40b-4 (hereinafter referred to also as data decision circuits 40b-0 to 40b-4); and data transfer circuits 32-0, 32-1, 32-3 and 32-4 (hereinafter referred to also as data transfer circuits 32-0 to 32-4).

A data selection circuit 52 and the standard data transfer circuit 34 are used to select the standard potential as the reference potential VBGR.

Figure 10:
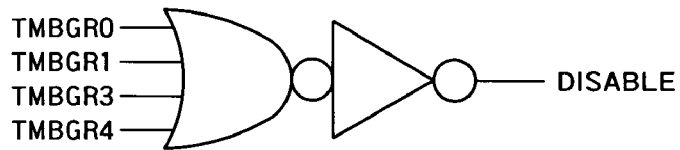
FIG. 10 is a circuit diagram of a standard data selection circuit 52.

FIG. 10 is a circuit diagram of the standard data selection circuit 52. The standard data selection circuit 52 outputs a high-level signal when any one of signals TMBGR0, TMBGR1, TMBGR3 and TMBGR4 (hereinafter referred to also as signals TMBGR0 to 4) is high. When the signals TMBGR0 to 4 are all low, the standard data selection circuit 52 outputs a low-level signal. That is, the standard data selection circuit 52 outputs the high-level signal as the signal DISABLE in the case of deselecting the signal TMBGR2, and outputs the low-level signal as the signal DISABLE in the case of selecting the signal TMBGR2.

Figure 11:
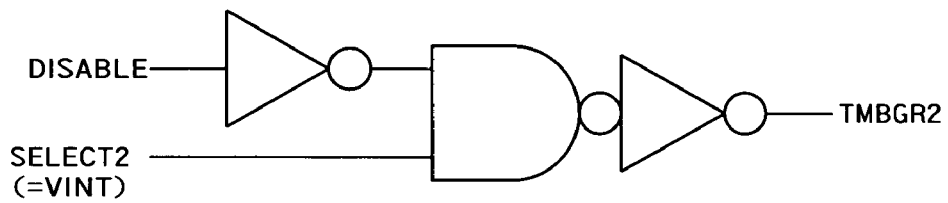
FIG. 11 is a circuit diagram of a standard data transfer circuit 34.

FIG. 11 is a circuit diagram of the standard data transfer circuit 34. The standard data transfer circuit 34 responds to the signal DISABLE from the standard data selection circuit 52 to select (high) or deselect (low) the signal TMBGR2. A signal SELECT2 is high. Accordingly, the standard data transfer circuit 34 deselects (low) the signal TMBGR2 when the signal DISABLE is high, and selects (high) the signal TMBGR2 when the signal DISABLE is low. In this way, the standard data selection circuit 52 and the standard data transfer circuit 34 select the signal TMBGR2. As a result, the standard potential is output as the reference potential VBGR.

Figure 12:
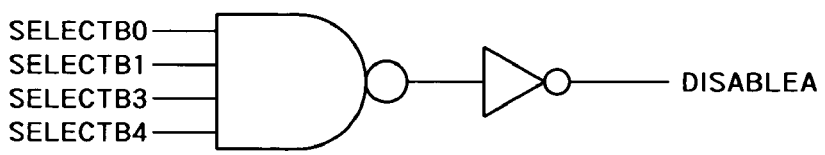
FIG. 12 is a circuit diagram of a data selection circuit 54.

FIG. 12 is a circuit diagram of a data selection circuit 54. The data selection circuit 54 outputs the signal DISABLEA for deselecting the data decision circuits 40a-0 to 40a-4 when the data decision circuits 40b-0 to 40b-4 are selected.

The data selection circuit 54 outputs a high-level signal when the data decision circuits 40a-0 to 40a-4 are selected in the D/S step. Thereafter, when the data decision circuits 40b-0 to 40b-4 are selected in the reliability test, any one of signals SELECTB0, 1, 3 and 4 becomes low. As a result, the data selection circuit 54 outputs a low-level signal as the signal DISABLEA.

Figure 13:
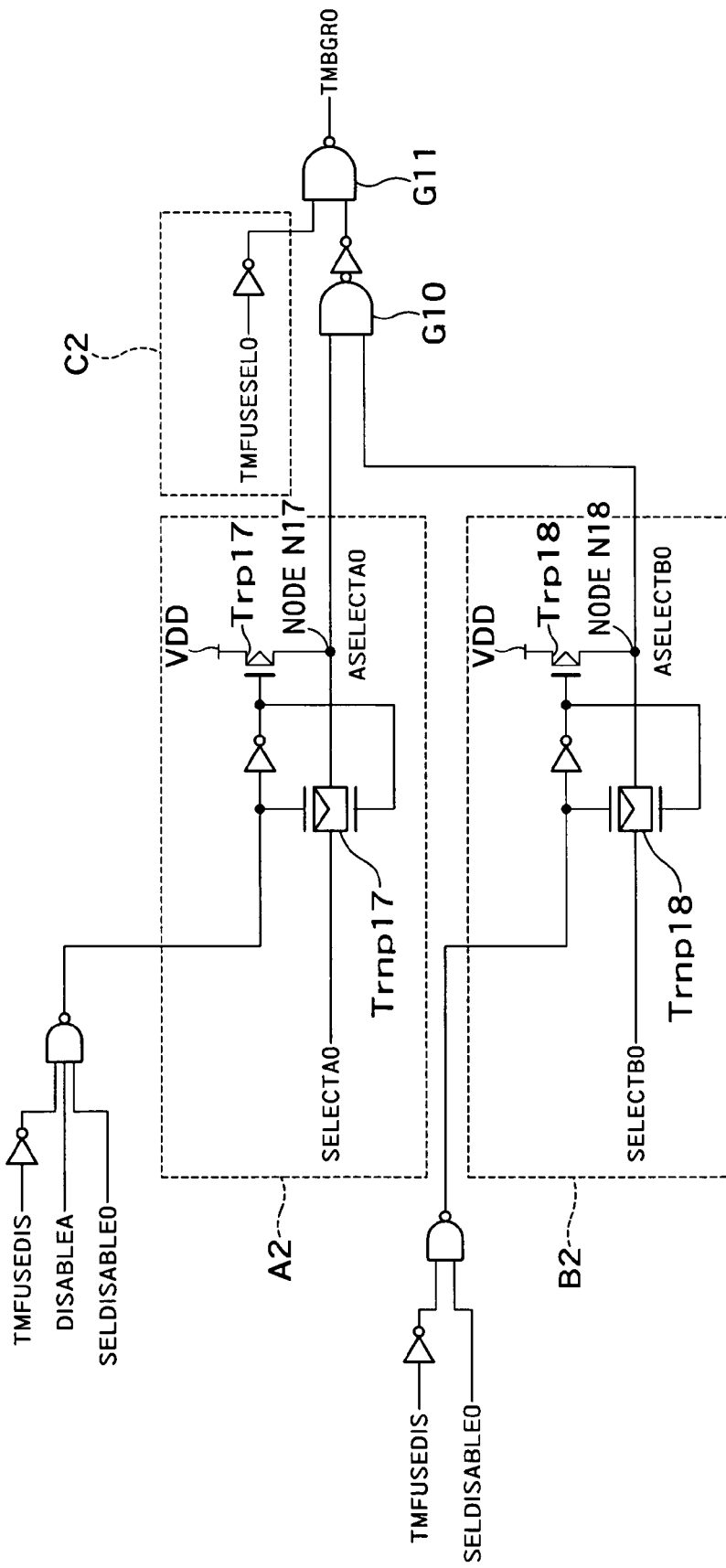
FIG. 13 is a circuit diagram of a data transfer circuit 32-0.
Figure 14:
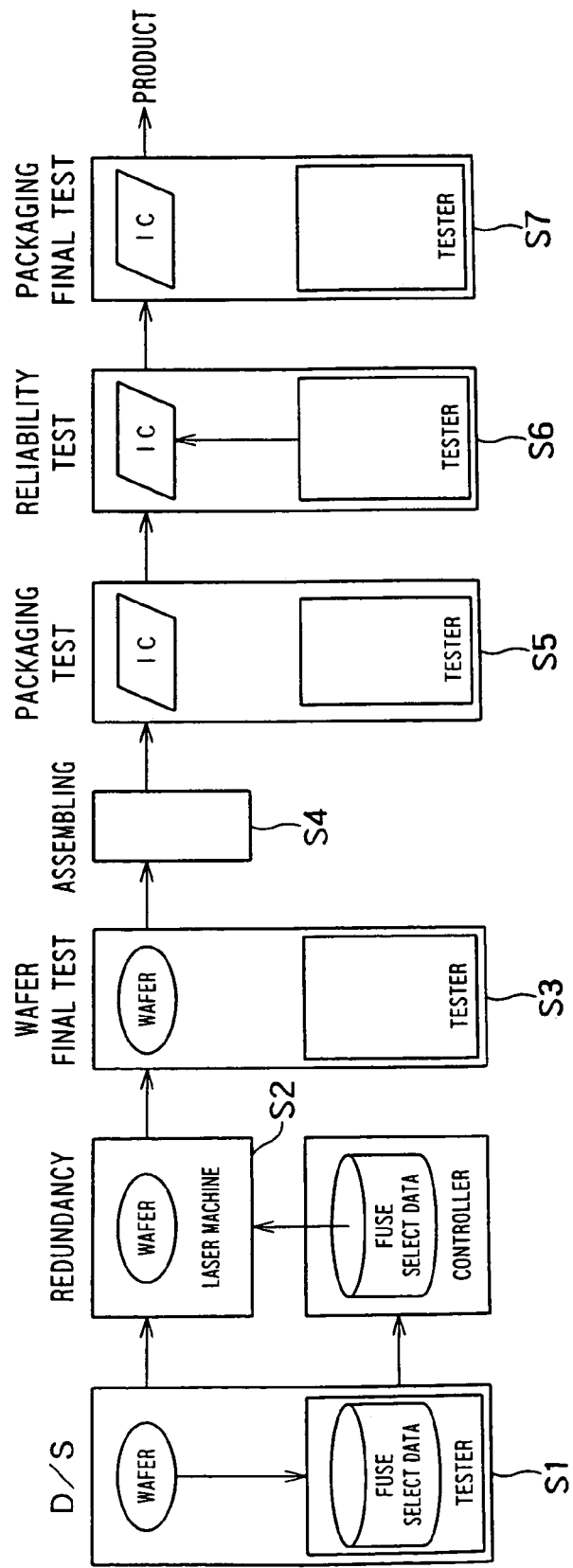
FIG. 14 is a diagram showing a conventional semiconductor device test procedure.
Figure 15:
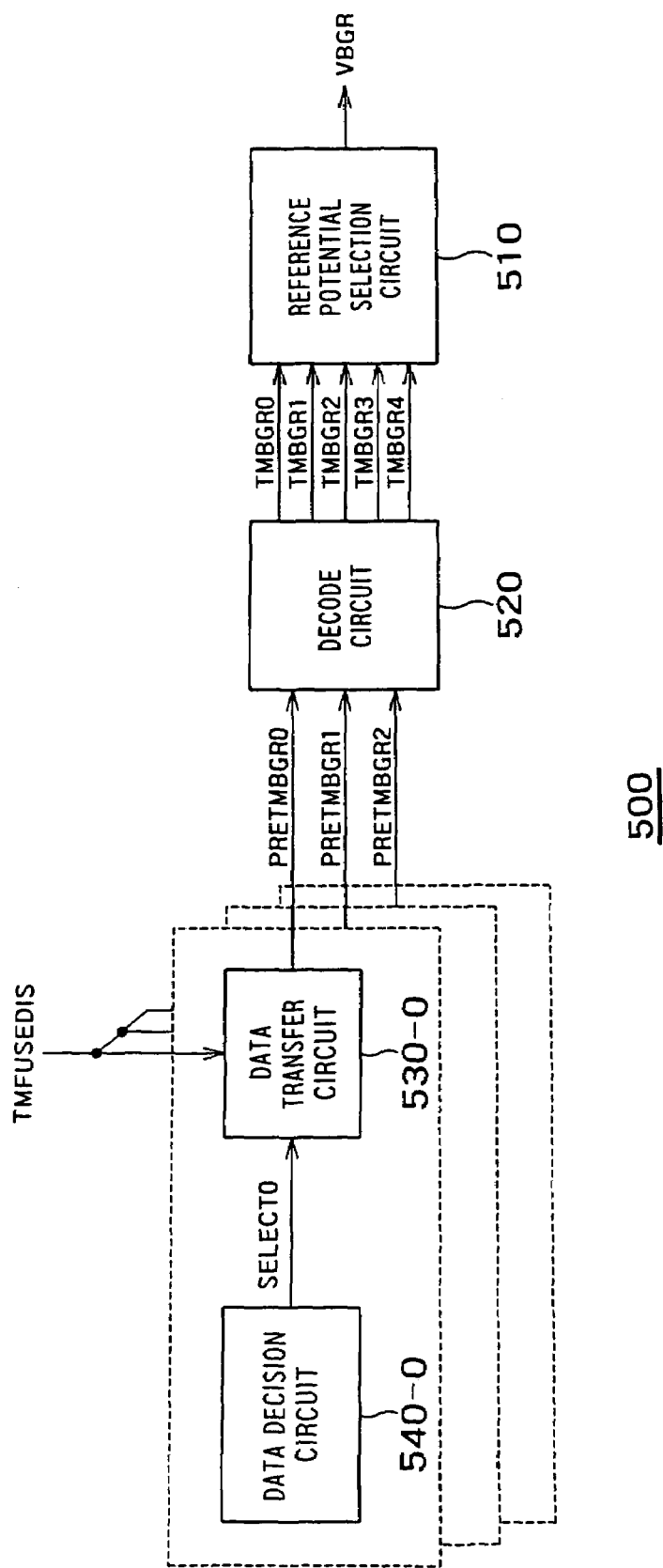
FIG. 15 is a block diagram of a conventional reference potential generator 500 that generates a reference potential VBGR.

FIG. 13 is a circuit diagram of the data transfer circuit 32-0. Since the data transfer circuits 32-1, 32-2 and 32-3 have the same configuration as that of the data transfer circuit 32-0, no description is repeated in connection with them. The broken-line box A2 indicates a configuration related to the data decision circuit 40a-0, the broken-line box B2 indicates a configuration related to the data decision circuit 40b-0, and the broken-line box C indicates a configuration related to the test mode.

In the broken-line box A2, the data transfer circuit 32-0 inputs the signal SELECTA0 from the data decision circuit 40a-0. The signal SELECTA0 is applied via a transistor Trnp17 to a node N17. The power supply voltage VDD is applied via a transistor Trp17 to the node N17. Accordingly, the potential of the signal ASELECTA0 at the node N17 is either the potential of the signal SELECTA0 or the potential (high) of the power supply voltage VDD.

A signal SELDISABLE0 is data output from a standard data decision circuit 60 (see FIG. 9). When the standard data decision circuit 60 is not used, signals SELDISABLE0 to SELDISABLE 4 are all high, whereas when the standard data decision circuit 60 is used, the signals SELDISABLE0 to SELDISABLE4 are all low. The signal TMFUSEDIS is used to output the standard potential as the reference potential VBGR in the test mode. The signal TMFUSEDIS is high only in the test mode and low in the other modes. The signal DISABLEA is fed from the data selection circuit 54, and it is high when the data decision circuits 40a-0 to 40a-4 are selected, and low when the data decision circuits 40a-0 to 40b-4 are selected.

When the data decision circuits 40a-0, 40a-1 and 40a-3 are selected, the signals SELDISABLE0 and DISABLEA are high, but the signal TMFUSEDIS is low. Accordingly the transistor Trnp17 turns ON, whereas the transistor Trp17 turns OFF. As a result, the signal SELECTA0 is sent to the node N17 to form the signal ASELECTA0.

When the standard data decision circuit 60 is selected, or the data decision circuits 40b-0 to 40b-4 are selected, or in the test mode, the signal SELDISALE0 is low, the signal DISABLEA is low, or the signal TMFUSEDIS is high. Accordingly, the transistor Trnp17 turns OFF and the transistor Trp17 urns ON. As a result, the potential of the power supply voltage VDD is sent to the node N17 to form the signal ASELECTA0. AT this time, the signal ASELECTA0 becomes high.

In the broken-line box B2, the data transfer circuit 32-0 inputs the signal SELECTB0 from the data decision circuit 40b-0. The signal SELECTB0 is applied via a transistor Trnp18 to a node N18. The power supply voltage VDD is applied via a transistor Trp18 to the node N18. Hence, the potential of the signal ASELECTB0 at the node N18 is either the potential of the signal SELECTB0 or the potential (high) of the power supply voltage VDD.

When the data decision circuits 40b-0 to 40b-3 are selected, the signal SELDISABLE0 is high and the signal TMFUSEDIS is low. Accordingly, the transistor Trnp18 turns ON and the transistor Trp18 turns OFF. As a result, the signal SELECTB0 is sent to the node N18 to form the signal ASELECTB0. Since in this case the signal DISABLEA is low, the data decision circuits 40*a*-0 to 40*a*-4 are deselected.

On the contrary, when the standard data decision circuit 60 is selected, or in the test mode, the signal SELDISABLE0 is low, or the signal TMFUSEDIS is high. Accordingly, the transistor Trnp18 turns OFF and the transistor Trp18 turns ON, through which the potential of the power supply voltage VDD is sent to the node N18 to form the signal ASELECTB0. In this case, the signal ASELECTB0 is always high.

In the broken-line box C, the data transfer circuit 32-0 inputs the external test signal TMFUSESEL0, which is always low except in the test mode.

In the test mode, high-level signals are always applied to two inputs of a NAND gate G10 irrespective of the state of the data decision circuits 40*a*-0 and 40*b*-0. Accordingly, a NAND gate G11 is supplied with a high-level signal from the NAND gate G10, and outputs the signal TMFUSESL0 as the signal TMBGR0.

In the case of outputting the standard potential as the reference potential VBGR, the potential (high) of the power supply voltage VDD is sent to both inputs of the NAND gate G1. The signal TMFUSESEL0 is low. Hence, the signal TMBGR0 is output as a low-level signal from the NAND gate G11.

"The signal TMBGR0 is low" means the signal TMBGR0 is not selected. Accordingly, by making all of the signals TMBGR0 to TMBGR4, except TMBGR2, low by the data transfer circuits 32-0 to 32-4, the standard potential can be selected as the reference potential VBGR. In this instance, the data selection circuit 53 and the standard data transfer circuit 34 select the signal TMBGR2 as described above. As a result, the reference potential VBGR becomes the standard potential.

When the standard data decision circuit 60 is not selected, or not in the test mode, the signal TMFUSESEL0 is low. Accordingly, data from any one of the data decision circuit 40*a*-0 to 40*a*-3 or 40*b*-0 to 40*b*-3 is output as the signal TMBGR0 from the NAND gate G11.

Since the test procedure of the reference potential generator 200 is the same as that in the first embodiment described previously with reference to FIGS. 7 and 8, no description is repeated.

While in the second embodiment the digital data is 5-bit data, it is not limited specifically thereto but the number of bits may be of 4 or smaller or more than 6. In this case, the data decision circuits 40*a*, the data decision circuits 40*b* and the data transfer circuits 30 are respectively provided by the number smaller by one than the number of bits used. Similarly, the number of external test signal TMFUSESEL is also set as above.

This embodiment produces the same effects as obtainable with the first embodiment. This embodiment requires no decode circuit.

What is claimed is:

1. A semiconductor device that generates an internal power supply by using, as a reference potential, a potential obtained by adjusting a preset standard potential, the semiconductor device comprising:
   a reference potential selection circuit selecting said reference potential on the basis of digital data from among a plurality of potentials of different levels which are obtained by dividing a power supply voltage, and outputting said reference potential in place of said standard potential;
   a first decision circuit deciding bits of said digital data;
   a second decision circuit deciding the bits of said digital data, separately from said first decision circuit; and
   a data transfer circuit transferring to said reference potential selection circuit said digital data which is decided by either one of said first and second decision circuits.

2. The semiconductor device according to claim 1, wherein
   said first and second decision circuits decide, respectively, the bits of the digital data on the basis of whether a wiring in said first and second decision circuits is conducting or non-conducting.

3. The semiconductor device according to claim 1 further comprising:
   a third decision circuit deciding bits of a standard digital data, said standard digital data being used to output the standard potential as the reference potential from the reference potential selection circuit;
   wherein the data transfer circuit transfers the standard digital data to the reference potential selection circuit without transferring the digital data from the first decision circuit and the second decision circuit in a case that the third decision circuit outputs said standard digital data.

4. The semiconductor device according to claim 3, wherein
   the third decision circuit includes a fuse, and decides the bits of the digital data on the basis of an output potential, said output potential being varied by the fuse being electrically connected or disconnected.

5. The semiconductor device according to claim 4, wherein
   the fuse is connected or disconnected by electrical processing.

6. The semiconductor device according to claum 1 further comprising:
   a test data input part that can tentatively receive test data having various values as the digital data from an external source;
   wherein the data transfer circuit tentatively transfers the test data to the reference potential selection circuit without transferring the digital data from the first decision circuit and the second decision circuit in a case that the test data input part receives said test data.

7. The semiconductor device according to claim 6, wherein
   the test data input part that can tentatively receive the standard digital data from an external source;
   wherein the data transfer circuit tentatively transfers the standard digital data to the reference potential selection circuit without transferring the digital data from the first decision circuit and the second decision circuit in a case that the test data input part receives the standard digital data.

8. The semiconductor device according to claim 6 further comprising:
   a select circuit selecting one of the first decision circuit, the second decision circuit and the test data input part;
   wherein the data transfer circuit transfers the digital data to the reference potential selection circuit from a circuit selected by the select circuit.

9. The semiconductor device according to claim 8, wherein
   the select circuit unselects one of the first decision circuit and the second decision circuit to select another of them, and selects neither the first decision circuit nor the second decision circuit to select the test data input part.

10. The semiconductor device according to claim 1, wherein
the first decision circuit and the second decision circuit include respectively a fuse, and decide the bits of the digital data on the basis of an output potential, said output potential being varied by the fuse being electrically connected or disconnected.

11. The semiconductor device according to claim 10, wherein
the fuse is connected or disconnected by electrical processing.

12. The semiconductor device according to claim 1, wherein
the internal power supply is used for reading a data from a memory embedded in the semiconductor device or for writing a data in the memory.

13. A method for testing a semiconductor device that includes: a reference potential selection circuit selecting a reference potential on the basis of digital data from among a plurality of potentials of different levels which are obtained by dividing a power supply voltage, and outputting said reference potential in place of a standard potential preset by default so as to generate an internal power supply; a first decision circuit deciding the value of said digital data; a second decision circuit deciding the value of said digital data separately from said first decision circuit; a test data input portion tentatively inputting various pieces of digital data of different values from output; and a data transfer circuit transferring digital data which is fed thereto from any one of said first decision circuit, said second decision circuit and said test data input portion to said reference potential selection circuit; the method comprising:
transferring said various pieces of digital data of different levels from said test data input portion to said reference potential selection circuit by said data transfer circuit, and measuring reference potentials on the basis of said various pieces of digital data of different levels, respectively; and
setting first digital data in said first decision circuit, said first digital data generating a first one of said reference potentials which is optimum for the generation of said desired internal power supply.

14. The method for testing a semiconductor device according to claim 13 further comprising after setting first digital data;
transferring said various pieces of digital data of different levels from said test data input portion to said reference potential selection circuit by said data transfer circuit, and measuring reference potentials again on the basis of said various pieces of digital data of different levels respectively;

setting second digital data in the second decision circuit in the case that a second one of said reference potentials, which is optimum for the generation of said desired internal power supply in the secondary measurement, is shifted from the first reference potential, said second digital data generating the second reference potential.

15. The method for testing a semiconductor device according to claim 14, wherein
the first measuring of the reference potentials and the setting of the first digital data are executed after manufacturing the semiconductor devices on the semiconductor wafer and before dicing the semiconductor wafer;
wherein the second measuring of the reference potentials and the setting of the second digital data are executed after assembling or packaging the semiconductor device.

16. The method for testing a semiconductor device according to claim 14, wherein
the first decision circuit and the second decision circuit include respectively a fuse;
wherein, during setting of the first digital data, the first digital data is decided in the first decision circuit by the fuse being connected or disconnected;
wherein, during setting of the second digital data, the second digital data is decided in the second decision circuit by the fuse being connected or disconnected.

17. The method for testing a semiconductor device according to claim 14, wherein
the semiconductor device further comprises a third decision circuit deciding bits of a standard digital data, said standard digital data being used to output the standard potential as the reference potential from the reference potential selection circuit;
wherein, in the case that it becomes clear that the standard potential is optimal as the reference potential in the second measuring of the reference potentials, the third decision circuit outputs the standard digital data, and the data transfer circuit transfers the standard digital data to the reference potential selection circuit during setting the second digital data.

18. The method for testing a semiconductor device according to claim 13, wherein
the first decision circuit includes respectively a fuse;
wherein, during setting of the first digital data, the first digital data is decided in the first decision circuit by the fuse being connected or disconnected.

* * * * *